United States Patent
Takaike

Patent Number: 5,844,750
Date of Patent: Dec. 1, 1998

[54] ACTUATOR ARM ASSEMBLY HAVING AN ACTUATOR ARM WIRING PATTERN AND A HEAD SUSPENSION WIRING PATTERN

[75] Inventor: Eiji Takaike, Kawasaki, Japan

[73] Assignee: Fujitsu Limited, Kawasaki, Japan

[21] Appl. No.: 370,613

[22] Filed: Jan. 10, 1995

[30] Foreign Application Priority Data

Mar. 17, 1994 [JP] Japan ................. 6-047167

[51] Int. Cl.⁶ .................................................. G11B 5/48
[52] U.S. Cl. ........................................................... 360/104
[58] Field of Search ................... 360/102–106, 360/108

[56] References Cited

U.S. PATENT DOCUMENTS

| | | | |
|---|---|---|---|
| 4,645,280 | 2/1987 | Gordon et al. | 360/104 |
| 4,670,804 | 6/1987 | Kant et al. | 360/102 |
| 4,761,699 | 8/1988 | Ainslie et al. | 360/104 |
| 4,819,094 | 4/1989 | Oberg | 360/104 |
| 4,991,045 | 2/1991 | Oberg | 360/104 |
| 4,996,623 | 2/1991 | Erpelding et al. | 360/104 |
| 5,006,946 | 4/1991 | Matsuzaki | 360/104 |
| 5,121,273 | 6/1992 | Siezak | 360/108 |
| 5,185,683 | 2/1993 | Oberg et al. | 360/104 |
| 5,198,945 | 3/1993 | Blaeser et al. | 360/104 |
| 5,392,179 | 2/1995 | Sendoda | 360/104 |
| 5,422,764 | 6/1995 | McIlvanie | 360/106 |
| 5,426,549 | 6/1995 | Sakai | 360/106 |
| 5,491,597 | 2/1996 | Bennin et al. | 360/104 |
| 5,519,552 | 5/1996 | Kohira et al. | 360/104 |
| 5,530,604 | 6/1996 | Pattanaik | 360/104 |
| 5,539,596 | 7/1996 | Fontana et al. | 360/106 |
| 5,594,607 | 1/1997 | Erpelding et al. | 360/104 |
| 5,597,496 | 1/1997 | Masaichi et al. | 360/104 |
| 5,612,840 | 3/1997 | Hiraoka et al. | 360/104 |

FOREIGN PATENT DOCUMENTS

| | | |
|---|---|---|
| 182376 | 3/1989 | Japan . |
| 421918 | 1/1992 | Japan . |
| 4155675 | 5/1992 | Japan . |

*Primary Examiner*—Jefferson Evans
*Attorney, Agent, or Firm*—Greer, Burns & Crain, Ltd.

[57] ABSTRACT

An inexpensive actuator arm assembly which is suitable for a small sized magnetic disk drive unit. The actuator arm assembly includes an actuator arm rotatably mounted on a base, and a non-metallic suspension having a base end portion fixed on a leading end portion of the actuator arm and a leading end for supporting a magnetic head. The non-metallic suspension has a wiring pattern connected to the magnetic head. A flexible printed circuit sheet is bonded on the side surface of the actuator arm, and is connected at the one end to the wiring pattern of the suspension.

10 Claims, 5 Drawing Sheets

ACTUATOR ARM ASSEMBLY HAVING AN ACTUATOR ARM WIRING PATTERN AND A HEAD SUSPENSION WIRING PATTERN

BACKGROUND OF THE INVENTION

1. Field of the Invention

The present invention generally relates to an actuator arm assembly of a magnetic disk drive unit, and particularly to a structure of a suspension for supporting a magnetic head.

2. Description of the Related Art

In recent years, it has become increasingly desirable to miniaturize and reduce the power consumption of a magnetic disk drive unit. Moreover, the capacity of magnetic disk drive units has been enlarged. This has been accomplished by enhancing the recording density of the media, and by increasing the number of magnetic disks mounted on a magnetic disk drive unit. In a magnetic disk drive unit for a computer, there has been generally adopted a contact-start-stop (CSS) system in relation to a magnetic head and a magnetic disk. In this system, during rotation of a magnetic disk, a head is floated while maintaining a micro-gap over the disk by the balance between the floating force due to the air flow generated by high speed rotation and a force of pressing the head on the disk by a suspension. As the rotation of the disk is stopped, the head is moved to a contact possible region on the disk where the head is contacted with the disk. During the stoppage of the rotation of the disk, the head is left to be contacted with the disk. The magnetic head is supported by a suspension formed of stainless steel, and the base end portion of the suspension is fixed on an actuator arm. In a small sized magnetic disk drive unit for driving a magnetic disk of 3.5 inches or less in diameter, a thin sheet suspension having a thickness of about 25 $\mu$m is used.

Conventionally, a pair of leads have been connected to a magnetic head for supplying a writing signal to the magnetic head and fetching the signal read from the magnetic head. In recent years, however, there is a tendency to replace the leads with a wiring pattern formed on a surface of a suspension. In a prior art suspension with a wiring pattern, as disclosed for example in Japanese laid-open Patent Publication No. HEI 4-21918, an insulating layer is formed on the suspension; a wiring pattern composed of a pair of copper films is formed on the insulating layer; and the wiring pattern is further covered with an insulating layer.

For a structure having the wiring pattern only buried in the insulating layer, the electromigration of copper ions tends to be generated. For this reason, in the above-described prior art structure, the wiring pattern has been sandwiched between a pair of barrier layers. Concretely, the lower and upper insulating layers were formed of polyimide, while the lower barrier layer was formed of Cr and the upper barrier layer was formed of Ti. Notwithstanding such a complex layered structure, it was difficult to perfectly prevent the electromigration of copper ions because the suspension was formed of a stainless steel sheet.

The prior art structure or arrangement has another disadvantage. To bias the head toward the disk, the suspension formed of a stainless steel sheet was rounded to form a plate spring portion; however, since this rounding was made by ironing of the suspension using a roller or the like, the wiring pattern was possibly damaged. Incidentally, the magnetic disk drive unit has been further promoted to be miniaturized, and a microminiature magnetic disk drive unit for driving a magnetic disk of 1.8 inches in diameter has started to be developed. Such a small sized magnetic disk drive unit requires reviewing the conventional materials of individual components.

SUMMARY OF THE INVENTION

It is, therefore, an object of the present invention to provide an inexpensive actuator arm assembly suitable for a small sized magnetic disk drive unit.

In accordance with an aspect of the present invention, there is provided an actuator arm assembly of a magnetic disk drive unit having a base, comprising: an actuator arm rotatably mounted on the base; a non-metallic suspension having a base end portion fixed to a leading end portion of the actuator arm and a leading end portion for supporting a magnetic head, said suspension having a wiring pattern connected to the magnetic head; and a flexible printed circuit sheet mounted on said actuator arm and connected at the one end to the wiring pattern of the suspension.

In accordance with another aspect of the present invention, there is provided an actuator arm assembly of a magnetic disk drive unit having a base, comprising: an actuator arm rotatably mounted on the base; and a non-metallic suspension integrated with a flexible printed circuit sheet, which is fixed on the actuator arm in such a manner as to project from a leading end of the actuator arm by a specified distance, and which supports a magnetic head at a leading end portion and has a wiring pattern connected to the magnetic head.

In the present invention, since the suspension is formed of a non-metallic material such as a resin, the complex layered structure of the wiring pattern in the prior art can be eliminated, thus simplifying the layered structure of the wiring pattern. Moreover, since the suspension itself is insulating, the wiring pattern can be perfectly insulated simply by being buried in the suspension, which eliminates concerns about generating the electromigration of copper ions.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE PREFERRED EMBODIMENTS

Figure 1:
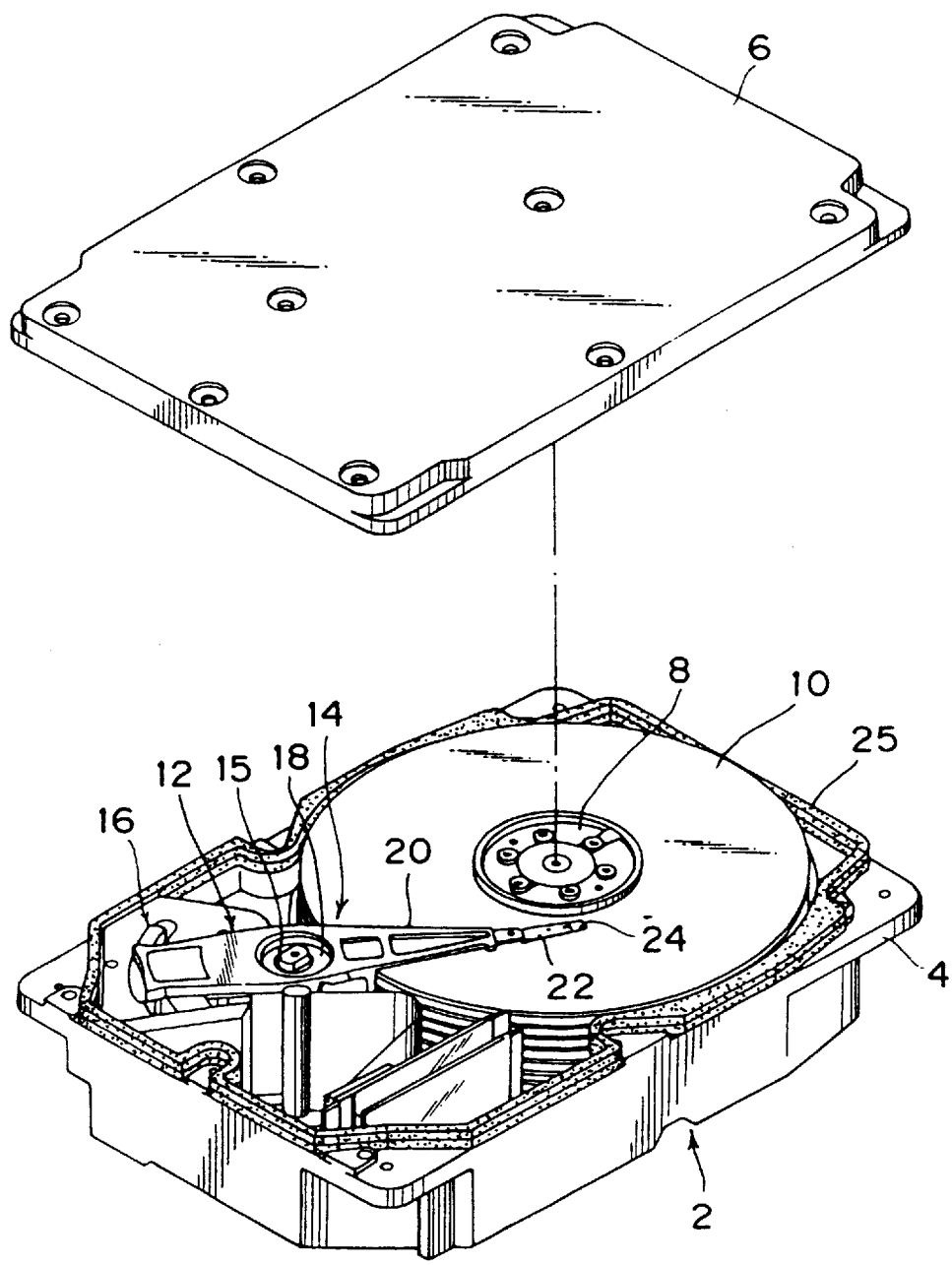
FIG. 1 is a schematic perspective view of a magnetic disk drive unit to which the present invention is applied.

Referring to FIG. 1, there is shown a perspective view of a magnetic disk drive unit using an actuator arm assembly of the present invention. Reference numeral 2 designates a housing (enclosure) composed of a base 4 and a cover 6. A spindle hub 8 rotated by an inner hub motor (not shown) is provided on the base 4. Magnetic disks 10 and spacers (not shown) are alternately inserted in the spindle hub 8, so that a plurality of the magnetic disks 10 are mounted in the spindle hub 8 in such a manner as to be spaced at specified intervals.

Reference numeral 12 designates a rotary type actuator assembly composed of an actuator arm assembly 14 and a magnetic circuit 16. The actuator arm assembly 14 includes an actuator block 18 rotatably mounted around a shaft 15 fixed on the base 4. A plurality of actuator arms 20 are integrally formed on the actuator block 18.

A pair of suspensions 22, each supporting a magnetic head 24 at the leading end, are fixed at the leading end of each actuator arm 20. An annular packing 25 is mounted on the base 4, and the interior of the magnetic disk drive unit is sealed by screwing the cover 6 with the base 4 while putting the annular packing 25 therebetween.

An actuator arm assembly according to a first embodiment of the present invention will be described with reference to FIG. 2. Suspensions 22 are bonded on the upper and lower surfaces of a leading end portion 20a of an actuator arm 20 formed of for example aluminum, respectively. The suspension 22 is formed of non-metallic material such as a polyimide sheet. A magnetic head 24 having a magnetic transducer is mounted by bonding or the like on the leading end portion of the suspension 22. The suspension 22 has further a wiring pattern 28 having the one end connected to the magnetic head 24.

A hole 23 is formed in the base end portion of the suspension 22. The suspension 22 is fixedly secured to the actuator arm 20 by fastening a screw in a screw hole formed at the leading end portion 20a of the actuator arm 20 by way of the hole 23 of the suspension 22. The above screwing may be replaced by caulking, riveting or the like. In an alternate embodiment, suspensions 22 may be clipped to the leading end portion 22a of the actuator arm 22.

Figure 3:
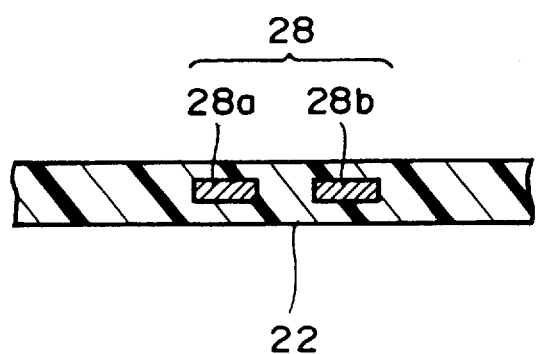
FIG. 3 is a sectional view taken along line A—A of FIG. 2.

The suspension 22 is fabricated as follows: First, a Cu film is uniformly coated on a first polyimide sheet by sputtering. The Cu film is then etched using a mask, to form a wiring pattern 28 composed of a signal line 28a and a grounding line 28b shown in FIG. 3. Next, a second polyimide sheet is covered on the wiring pattern 28. The first and second polyimide sheets are thermally bonded with each other and then cut at a specified length. The thickness of the suspension 22 thus fabricated is preferably in the range of from 125 to 300 $\mu$m. The portion, of the suspension 22, projecting from the leading end portion 20a of the actuator arm 20 has preferably dimensions of 10 mm or less in length and 5 mm or less in width.

As a result of experiments, when a magnetic disk was rotated at 3600 rpm in the state that a magnetic head (slider) 24 having a weight of 3 mg was supported by the polyimide-made suspension 22 having such dimensions, the magnetic head 24 could be floated from the magnetic disk by about 0.05 $\mu$m. The material of the suspension 22 is not limited to polyimide, and may include other resins such as teflon and epoxy resin, non-metallic inorganic materials, and composite materials.

Figure 2:
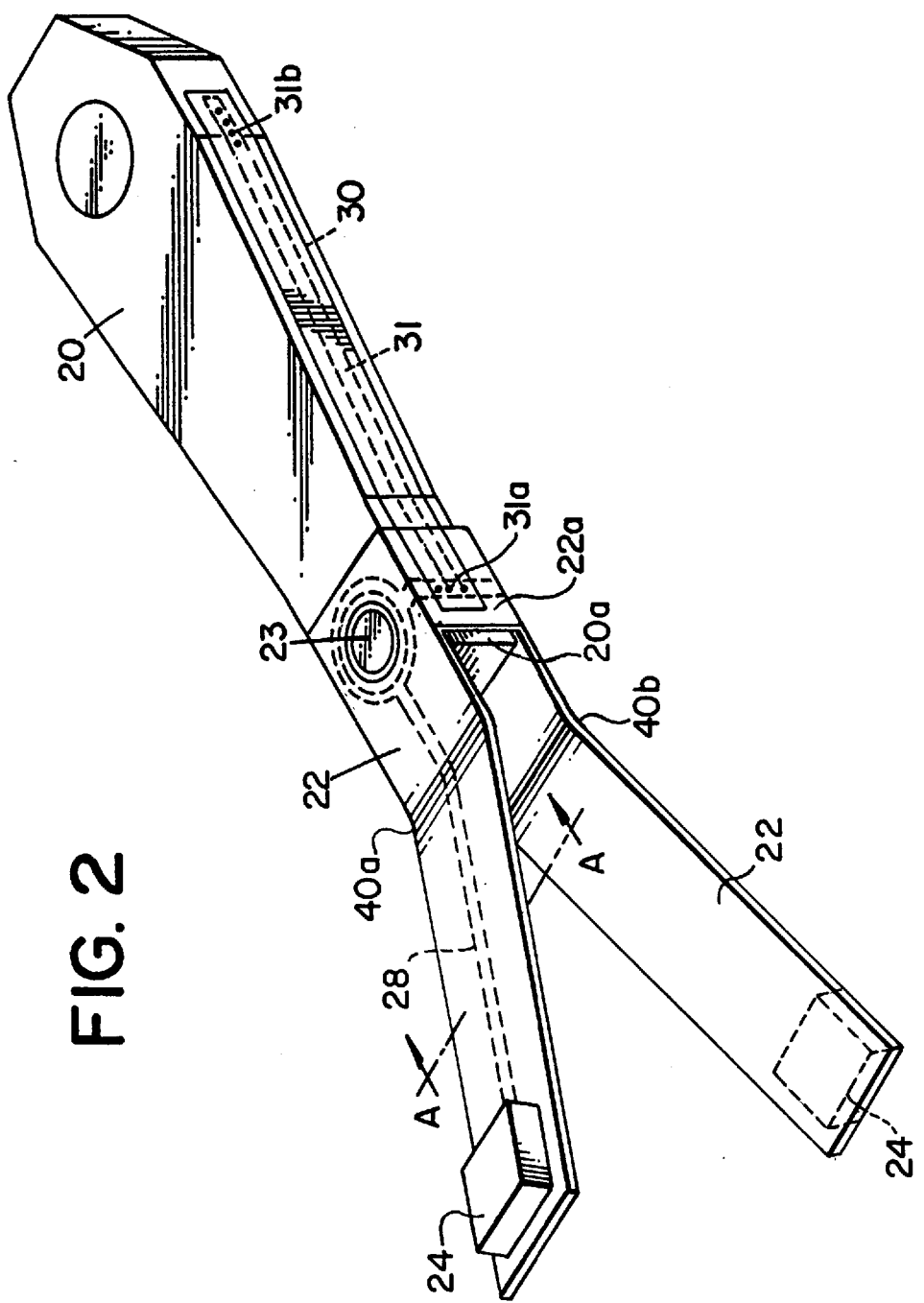
FIG. 2 is a schematic perspective view of a first embodiment of the present invention.

In FIG. 2, a pair of the suspensions 22 are integrally connected to each other at a connecting portion 22a having top and bottom rounded edge portions 40a and 40b. The connecting portion 22a is bonded to the side surface of the leading end 20a of the actuator arm 20. A flexible printed circuit sheet (FPC sheet) 30 having a wiring pattern 31 is bonded to the side surface of the actuator arm 20. The wiring pattern 31 of the FPC sheet 30 is connected to the wiring pattern 28 of the suspension 22 at a first connecting portion 31a, and is connected to the other FPC sheet (not shown) at a second connecting portion 31b.

Figure 4:
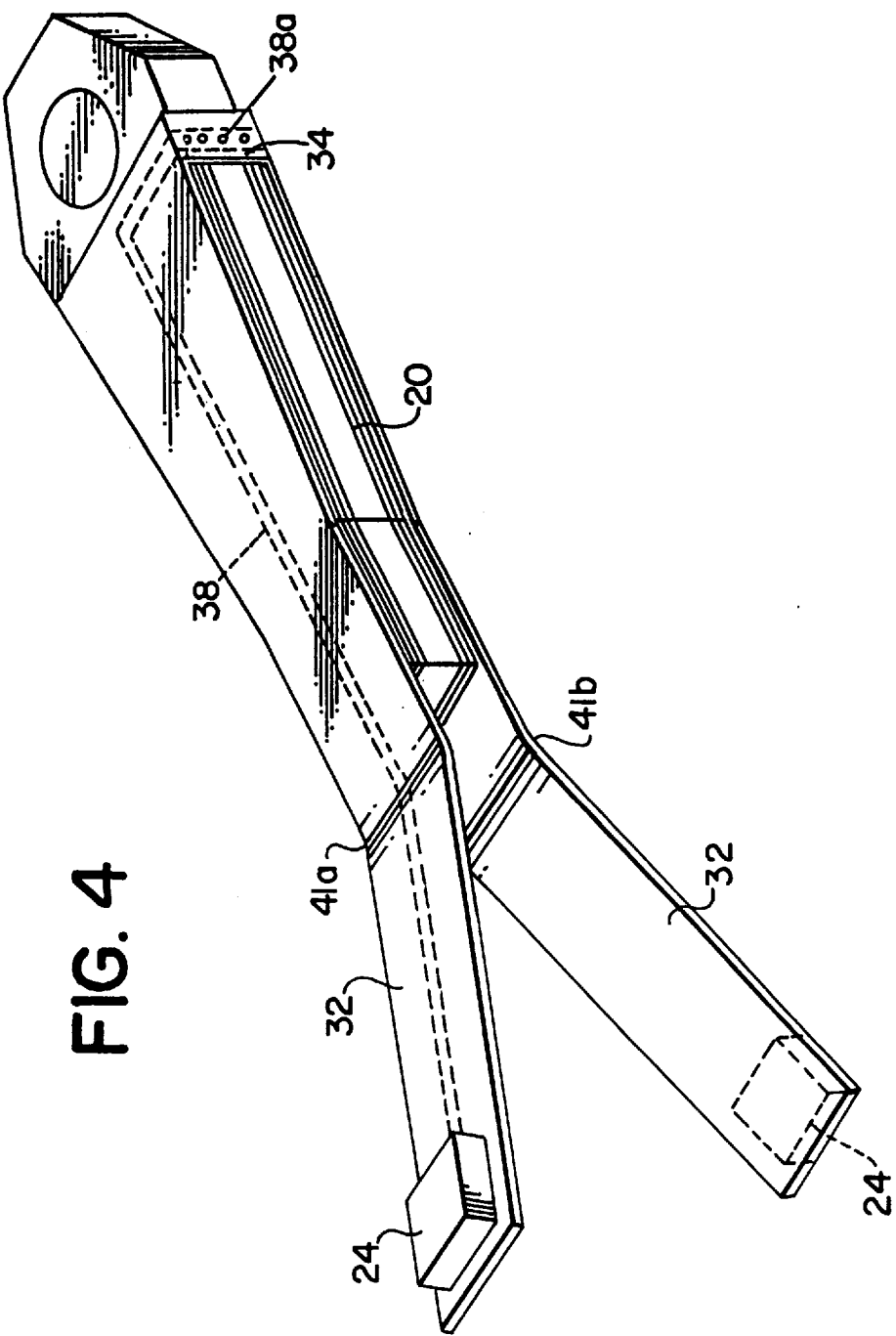
FIG. 4 is a schematic perspective view of a second embodiment of the present invention.

FIG. 4 shows an actuator arm assembly according to a second embodiment of the present invention. In this embodiment, there is used a suspension 32 integrated with a FPC sheet. Like the above-described first embodiment, the suspension 32 is formed of a resin such as polyimide. The suspension 32 has a wiring pattern 38 similar to that in the first embodiment, and is bonded to each of the upper and lower surfaces of the actuator arm 20. A pair of the suspensions 32 bonded to the upper and lower surfaces of the actuator arm 20 are integrally connected to each other at a connecting portion 34. The connecting portion 34 has top and bottom rounded edge portion 41a and 41b.

The wiring pattern 38 is connected at the one end to a magnetic head 24. Moreover, a portion of the wiring pattern 38 formed on the connecting portion 34 of the suspension 32 has a connecting portion 38a. In the suspension 32, the dimensions such as the thickness, the length and width of the portion projecting from the leading end portion of the actuator arm 20, are the same as those of the suspension 22 of the above-described first embodiment. The suspension 32 in this embodiment is of a type integrated with a FPC sheet, so that it can be fabricated at a low cost, and particularly, it is suitable for a microminiature magnetic disk drive unit for driving a magnetic disk of for example 1.8 inches in diameter.

Figure 5:
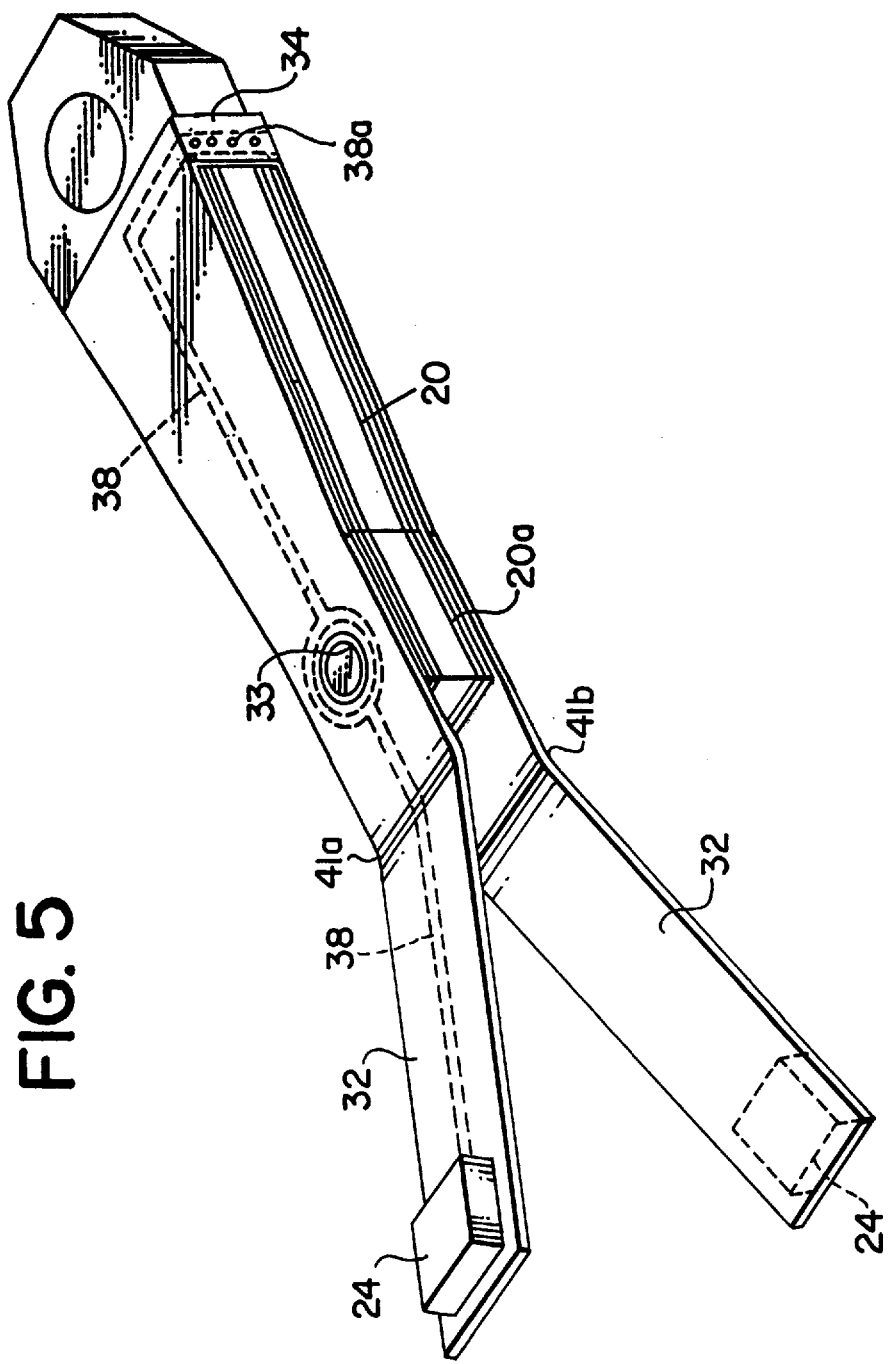
FIG. 5 is a schematic perspective view of a third embodiment of the present invention.

Referring to FIG. 5, there is shown a perspective view of an actuator arm assembly according to a third embodiment of the present invention. This embodiment is a modification of the above-described second embodiment, wherein the suspension 32 has a fixing hole 33. Moreover, a screw hole is formed on the leading end portion 20a of the actuator arm 20 at a position corresponding to the hole 33. The suspension 32 is fixedly secured to the actuator arm 20 by fastening a screw in the screw hole by way of the hole 33. The other construction of this embodiment is the same as that of the second embodiment, except for a wiring pattern 38 near the hole 33.

In each of the above-described embodiments, when each of the suspensions 22 and 32 is round to obtain a desirable elasticity, the rounding is easily performed by heating. Moreover, since each of the suspensions 22 and 32 is formed of a thin sheet of a resin such as polyimide, the wiring pattern is not damaged even by rounding the suspension by 90°. Although the present invention has been described with respect to the floating type magnetic head in each of the above-described embodiments, the invention is not limited thereto but may be applied to a contact type magnetic head in which a head contacts with a disk.

In the present invention, since a suspension is formed of an insulating material such as a resin, it is sufficient to have a wiring pattern only buried in the suspension, which simplifies the structure of the wiring pattern. Moreover, since the surroundings of the wiring pattern are perfectly insulated, it becomes possible to perfectly prevent the electromigration of copper ions. Additionally, since the suspension is formed of a non-metallic material, it can be fabricated at a low cost, and particularly, it is suitable for a small-sized magnetic disk drive unit.

What is claimed is:

1. An actuator arm assembly of a magnetic disk drive unit having a base, comprising:

an actuator arm rotatably mounted on the base;

a non-metallic suspension having a base end portion fixed to a leading end portion of said actuator arm, said suspension having a leading end portion for supporting a magnetic head, said suspension further having a wiring pattern connected to said magnetic head and a rounded bend portion adjacent to said base end portion for elastically biasing said magnetic head toward a magnetic disk said rounded bend portion being formed by a heat treatment to said suspension having said wiring pattern a flexible printed circuit sheet mounted on said actuator arm and connected at the one end to said wiring pattern of said suspension.

2. An actuator arm assembly of a magnetic disk drive unit according to claim 1, wherein said non-metallic suspension is formed of a resin.

3. An actuator arm assembly of a magnetic disk drive unit according to claim 1, wherein said wiring pattern is buried in said suspension.

4. An actuator arm assembly of a magnetic disk drive unit having a base, comprising:

an actuator arm rotatably mounted on said base; and a non-metallic suspension integrated with a flexible printed circuit sheet, which is fixed on said actuator arm in such a manner as to project from a leading end of said actuator arm a specified distance, said non-metallic suspension supporting a magnetic head at a leading end portion thereof and having a wiring pattern connected to said magnetic head, said non-metallic suspension further having a rounded bend portion adjacent to the leading end portion of said actuator arm for elastically biasing said magnetic head toward a magnetic disk, said rounded bend portion being formed by a heat treatment to said suspension having said wiring pattern.

5. An actuator arm assembly of a magnetic disk drive unit according to claim 4, wherein said non-metallic suspension is formed of a resin.

6. An actuator arm assembly of a magnetic disk drive unit according to claim 5, wherein said non-metallic suspension is fixedly screwed to the leading end of said actuator arm.

7. An actuator arm assembly of a magnetic disk drive unit according to claim 5, wherein said wiring pattern is buried in said non-metallic suspension.

8. An actuator arm assembly of a magnetic disk drive unit having a base, comprising:

an actuator arm rotatably mounted on the base;

a non-metallic upper suspension having a base end portion fixed to a leading end portion of said actuator arm, said upper suspension having a leading end portion for supporting a first magnetic head, said upper suspension further having a first wiring pattern connected to said first magnetic head and a first rounded bend portion adjacent to said base end portion of said upper suspension for elastically biasing said magnetic head toward a magnetic disk, said first rounded bend portion being formed by a heat treatment to said upper suspension having said first wiring pattern; and a non-metallic lower suspension having a base end portion fixed to a leading end portion of said actuator arm, said lower suspension having a leading end portion for supporting a second magnetic head, said lower suspension being integrally connected with said upper suspension by a connecting portion and having a second wiring pattern connected to said second magnetic head and a second rounded bend portion adjacent to said base end portion of said lower suspension for elastically biasing said magnetic head toward said magnetic disk, said second rounded bend portion being formed by a heat treatment to said lower suspension having said second wiring pattern; and said upper and lower suspensions being fixed to said leading end portion of said actuator arm by a clip.

9. An actuator arm assembly of a magnetic disk drive unit according to claim 8, wherein said wiring pattern is buried in said suspension.

10. An actuator arm assembly of a magnetic disk drive unit according to claim 8, wherein said non-metallic suspension is formed of a resin.

* * * * *